United States Patent [19]

Schulze et al.

[11] Patent Number: 5,049,965
[45] Date of Patent: Sep. 17, 1991

[54] THYRISTOR HAVING ADJUSTABLE BREAKOVER VOLTAGE AND METHOD OF MANUFACTURE

[75] Inventors: Hans-Joachim Schulze, Ottobrunn; Heinz Mitlehner, Munich, both of Fed. Rep. of Germany

[73] Assignee: Siemens Aktiengesellschaft, Berlin and Munich, Fed. Rep. of Germany

[21] Appl. No.: 269,376

[22] Filed: Nov. 10, 1988

[30] Foreign Application Priority Data

Nov. 20, 1987 [DE] Fed. Rep. of Germany ....... 3739394

[51] Int. Cl.$^5$ .................... H01L 29/74; H01L 29/747
[52] U.S. Cl. ......................................... 357/38; 357/39
[58] Field of Search .................................. 357/38, 39

[56] References Cited

U.S. PATENT DOCUMENTS 4,278,475  7/1981  Bartko et al. ......................... 357/38
4,572,947  2/1986  Kao et al. ............................. 357/38

FOREIGN PATENT DOCUMENTS 1614500  9/1977  Fed. Rep. of Germany .... 357/38 E
0112073 12/1982  Japan .................................. 357/38 G Primary Examiner—Rolf Hille
Assistant Examiner—Wael Fahmy

[57] ABSTRACT

A thyristor with an npnp layer sequence in which the p-emitter (4) comprises a sub-region (15) in the lateral region of an ignition contact (8) or of a light-sensitive zone (17a), this sub-region (15) being provided with a higher doping concentration that the remaining part of the p-emitter (4). A controllable over voltage ignition of the thyristor occurs at an adjustable, reduced breakover voltage, such breakover voltage being established by selectively irradiating a zone of the thyristor to reduce the breakover voltage point.

4 Claims, 2 Drawing Sheets

THYRISTOR HAVING ADJUSTABLE BREAKOVER VOLTAGE AND METHOD OF MANUFACTURE

BACKGROUND OF THE INVENTION

The invention is directed to a thyristor and more particularly to a thyristor with a reduced breakover voltage.

When, in a thyristor, the voltage that is applied between the cathode electrode and the anode electrode, and that blocks the thyristor, is increased to the value of what is referred to as the breakover voltage, then a local breakdown occurs of the pn-junction that separates the p-base from the n-base and proceeds about parallel to a principal face of the semiconductor body. In general, the breakdown appears at that edge of this pn-junction that lies in the lateral surface of the thyristor. In order to avoid such a uncontrollable local breakdown that very often leads to the destruction of the thyristor, European Pat. Publication No. EP-A-0 088 967 discloses that the pn-junction between the p-base and the n-base may be provided with a projecting part that reduces the thickness of the n-base, formed, for example, by means of irradiation with a laser beam under the central ignition contact of the thyristor, and to thus produce a breakdown at a reduced breakover voltage, this breakdown appearing in the region of the projecting part. This breakdown leads to an over voltage ignition of the thyristor so that a thermic destruction does not occur as a result of the reduced breakover voltage. What is disadvantageous, however, is that the reduced breakover voltage cannot be set to a defined voltage value with the desired precision and reproducibility.

SUMMARY OF THE INVENTION

The object of the invention is to specify a thyristor of the species initially cited wherein the pn-junction between the p-base and the n-base breaks down in defined fashion, when a reduced breakover voltage that can be set in a simple way is reached, this breakdown occurring without thermal destruction. This is achieved by the present invention.

The advantage obtainable with the invention is especially that a reduced breakover voltage at which the pn-junction between the p-base and the n-base of the thyristor breaks down, without the thyristor suffering damage, can be set with adequate precision and reproducibility.

SUMMARY OF THE DRAWINGS

The invention shall be set forth in greater detail below with reference to the drawings, in which.

DESCRIPTION OF THE PREFERRED EMBODIMENT

Figure 1:
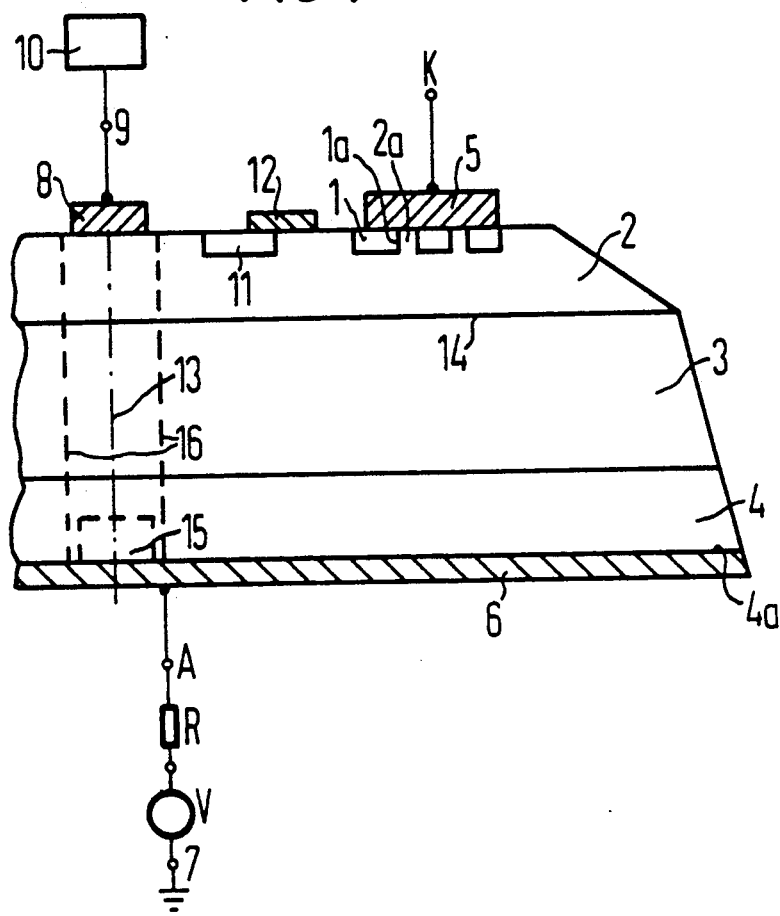
FIG. 1 illustrates a first exemplary embodiment of the invention.

FIG. 1 shows a power thyristor that comprises a doped semiconductor body having four successive semiconductor layers of alternating conductivity types. In detail, these are composed of an n-emitter 1, of a p-base 2, of an n-base 3 and of a p-emitter 4. The n-emitter 1 is contacted by an electrode 5 at the cathode side that is provided with a terminal K; the p-emitter 4 is contacted by an electrode 6 at the anode side that is provided with a terminal A. An external circuit connected at A is composed of a load resistor R and of a voltage source V lying in series therewith, this voltage source V, for example, outputting a d.c. (or a.c.) voltage of 1000 volts between R and a terminal 7 at reference potential. The terminal K is also connected to reference potential. The electrode at the anode side is thereby placed at a potential that is positive in comparison to K, by the voltage supplied by V, so that the thyristor is in what is referred to as its blocked condition.

An ignition contact or gate 8 that contacts the p-base 2 is provided with a terminal 9 to which a positive voltage pulse is supplied by a gate trigger circuit referenced 10 in order to ignite the thyristor. When the ignition switches the thyristor situated in its blocking condition into its current-carrying condition, then it closes the external circuit that proceeds A,R,V,7 and K via a low-impedance connection of K and A. The quenching of the thyristor, i.e. the conversion thereof into the high-impedance, non-current-conducting condition, ensues by switching off the voltage source V or, in case V is an a.c. voltage source, ensues at the first zero-axis crossing of the a.c. voltage supplied by V that appears after the ignition.

An n-conductive region 11 inserted into the p-base is provided with a conductive coating 12 that is extended to such an extent in the direction toward the n-emitter 1 that it shorts the p-n junction between 11 and 2. The parts 11 and 12 then form what is referred to as an auxiliary emitter or amplifying gate that represents an internal ignition amplification of the thyristor. In the case of a dynamically balanced structure of the thyristor, the dot-dash line 13 is the axis of symmetry of the thyristor. Reference numeral 1a references recesses of the n-emitter 1 that are filled out with corresponding projections 2a of the p-base 2. The latter are contacted by the electrode 5 of the cathode side. The parts 1a and 2a form emitter-base shorts that prevent an undesired ignition of the thyristor given the application of blocking voltages.

A p-n junction 14 that is biassed in non-conducting direction, in the case of application of a blocking voltage to the terminals A and K, is situated between the p-base 2 and the n-base 3. When the blocking voltage lying between A and K is raised to the value of what is referred to as the breakover voltage, then the local breakdown of the pn-junction 14 that then arises leads to a uncontrollable ignition of the thyristor that can thermally destroy it.

In order to eliminate this risk, the doping concentration of the p-emitter 4 within a sub-region 15 is inventively dimensioned higher than in the remaining part of the p-emitter 4. The sub-region 15 thereby lies roughly under the ignition or gate contact 8 or, in the case of a concentric or axial symmetric fashioning of the thyristor, lies in the region of the axis of symmetry in order to guarantee an optimally fast ignition propagation. In FIG. 1, the sub-region 15 lies immediately adjacent to the outer boundary surface 4a of the p-emitter 4 that is contacted by the electrode 6 of the anode side, and has a penetration depth that is less than the penetration depth of the p-emitter 4. On the other hand, the penetration depth of the sub-region 15 can, alternatively, correspond to that of the p-emitter 4 or can be even greater. Further, is also possible, alternatively, that the sub-region 15 of the p-emitter 4 is separated from the boundary surface 4a by a sub-layer of the p-emitter 4. This case could be illustrated in FIG. 1 by a vertical displacement of the sub-region 15 drawn with broken lines, in the upward direction. With the arrangement of FIG. 1, when the doping concentration of the p-emitter 4 at the boundary surface 4a to the electrode 6 of the anode side amounts to about $10^{18}cm^{-3}$, then a corresponding value of $10^{20}cm^{-3}$ should be expediently provided for the sub-region 15. The increase of the doping concentration within the sub-region 15 produces an increase in the gain $\alpha_{pnp}$ critical for the layer sequence 2, 3 and 4 in the region of the axis 13 of symmetry, this resulting in a reduction of the breakover voltage to the value of a reduced breakover voltage. The boosting of the doping concentration in the sub-region 15 is accomplished advantageously by way of an ion implantation that is followed by a tempering step. What is to be understood by the latter is a heating of the semiconductor body to about 950°C. through 1200°C. for a time space of, for example, 30 minutes to 30 hours.

The reduced breakover voltage that has been set in the described way can be shifted in the direction of higher values by irradiating the semiconductor body with electrons or protons in the region of the ignition contact 8. This causes the lifespan of the carriers and, thus, the gain $\alpha_{pnp}$ to be lowered in the irradiated region. In FIG. 1, the roughly cylindrical region that has been irradiated in this way is indicated by the broken boundary lines 16.

After the irradiation of the region 16 with electrons or protons has been carried out, the amount by which the reduced breakover voltage has been shifted in the direction toward higher voltages can still be corrected by applying a further tempering step, i.e. can be slightly diminished. In the further tempering step, the semiconductor body is exposed to a temperature of, for example, 250° through 350°C. over a prescribed time span of, for example, 30 minutes through 20 hours, whereby the lifespan of the carriers in the region 16 is again slightly lengthened. This irradiation and the further tempering step then effect an advantageous fine adjustment of the reduced breakover voltage.

Figure 2:
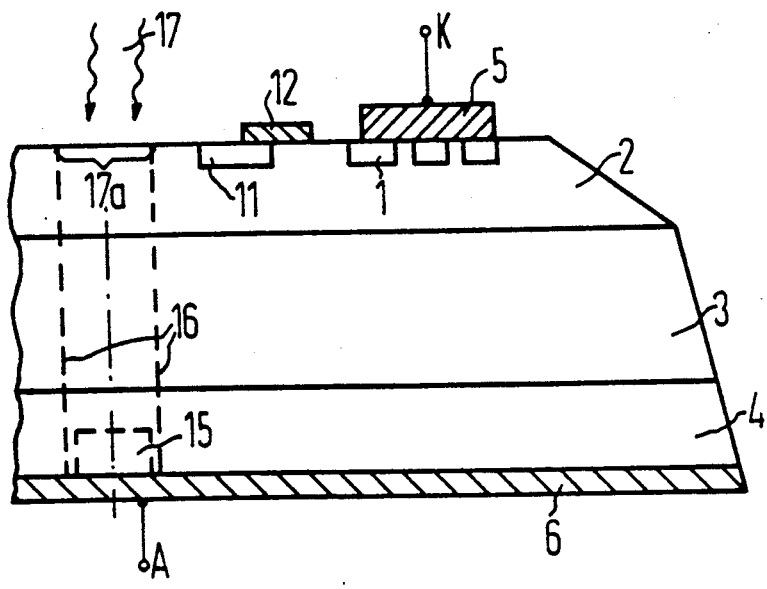
FIG. 2 illustrates a second exemplary embodiment.

FIG. 2 shows a light-triggerable thyristor wherein the electrical ignition with the ignition contact 8 is replaced by a light ignition by irradiating a light-sensitive thyristor zone 17a lying roughly in the region of the axis 13 of symmetry with a light pulse. The light pulse is reference 17 in FIG. 2. A light guide that, in particular, can be fashioned as disclosed in detail in European Pat. Publication No. EP-A-O 197 512 is generally used for supplying the light pulse. Here, too, a reduced breakover voltage is set by the sub-region 15, and this reduced breakover voltage can be shifted in the direction toward higher voltages with an additional irradiation of a region 16 extending from the light-sensitive thyristor zone in vertical direction up to the electrode 6 of the anode side with electrons or protons. The amount of this shift can again be slightly reduced by a tempering step. In the arrangement of FIG. 2, an advantageous effect is achieved that the light sensitivity is increased by the increased gain $\alpha_{pnp}$ without significant disadvantage for the dV/dt behavior.

Figure 3:
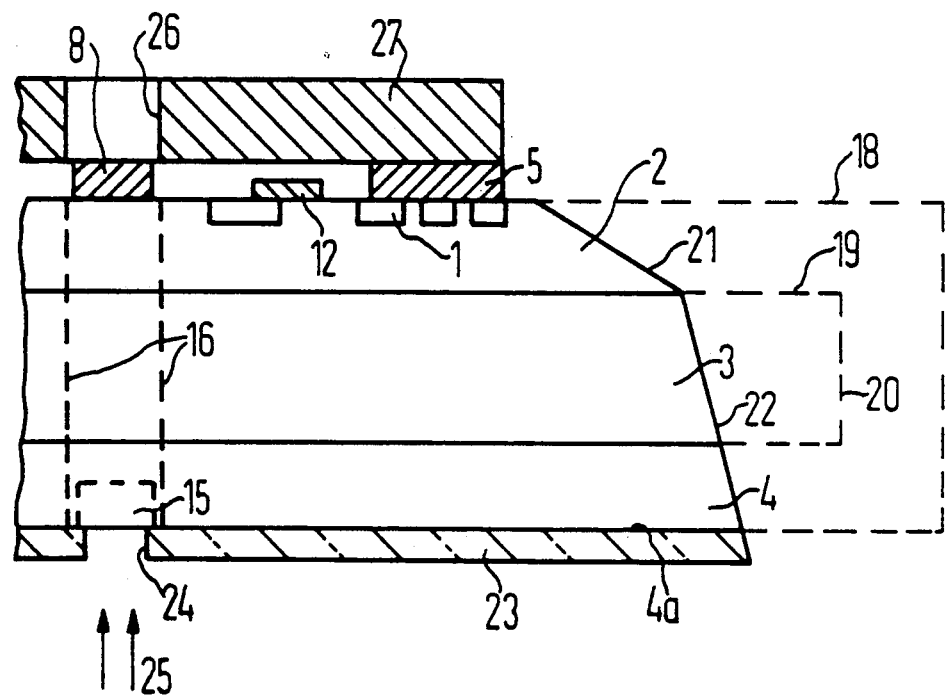
FIG. 3 illustrates a preferred method for the manufacture of a thyristor of FIGS. 1 or 2.

In the manufacture of a thyristor of the invention, one proceeds on the basis of a n-conductive semiconductor body 18 in the form of a flat wafer that is provided with a p-diffusion zone at the edge side in a known way, this p-diffusion zone extending into the semiconductor body up to the lines 19 and 20 (FIG. 3). After the removal of the wafer edge up to the lateral faces 21 and 22, the upper part of the p-diffusion zone represents the p-base 2, whereas the lower part of the p-diffusion zone forms the p-emitter. After the application of a mask 23 of $SiO_2$ or of light-sensitive lacquer, a mask window 24 is provided in a photolithographic way, and acceptor ions having an implantation does of, for example, $10^{16}cm^{-2}$ are introduced through this window in a following implantation step that is referenced 25. The more highly doped sub-region 15 of the p-base 4 then arises in the following tempering step. The irradiation of the region 16 with electrons or protons is undertaken in a particle beam apparatus, whereby a mask 27 provided with a hole 26 prevents the irradiation of the thyristor parts lying outside of 16. It is of particular advantage that this irradiation can also be undertaken at the finished thyristor that, for example, is already provided with the coatings or, respectively, electrodes 8, 12, 5 and 6. The mask 27 can also be composed of a dotting contact that is put in place on the electrode 5 during operation for better conductance of the load current. The correction of the shift of the breakover voltage undertaken by irradiation with electrons or protons can also ensue at the finished thyristor on the basis of the said further tempering step.

Optionally, the parts 11 and 12, serving the purpose of internal ignition amplification, can be eliminated in a thyristor of the invention.

It will be apparent that various modifications and/or additions may be made in the apparatus of the invention without departing from the essential feature of novelty involved, which are intended to be defined and secured by the appended claims.

It is claimed:

1. A thyristor comprising a semiconductor body that comprises an n-emitter (1) contacted by a cathode electrode (5) and having an adjacent p-base and that comprises a p-emitter (4) contacted by an anode electrode (6) and having an adjacent n-base (3) that is in turn separated from said p-base (2) by a p-n junction (14), characterized by a sub-region (15) of said p-emitter that is arranged in the lateral region of an ignition contact (8) and exhibits a higher p-doping concentration than the remaining parts of said p-emitter (4).

2. The thyristor according to claim 1, characterized in that a region (16) lies under said ignition contact (8), which region is irradiated with electrons or protons.

3. A thyristor comprising a semiconductor body that comprises an n-emitter (1) contacted by a cathode electrode (5) and having an adjacent p-base and that comprises a p-emitter (4) contacted by an anode electrode (6) and having an adjacent n-base (3) that is in turn separated from said p-base (2) by a p-n junction (14), characterized by a sub-region (15) of said p-emitter that is arranged in the lateral region of a light-sensitive thyristor zone (17a) and exhibits a higher doping concentration than the remaining parts of said p-emitter (4).

4. The thyristor according to claim 1, characterized in that a region (16) lies under said light-sensitive thyristor zone (17a), which region is irradiated with electrons or protons.

* * * * *